(12) United States Patent
Lu

(10) Patent No.: US 11,600,745 B2
(45) Date of Patent: Mar. 7, 2023

(54) SEMICONDUCTOR LIGHT-EMITTING DEVICE

(71) Applicant: KAISTAR Lighting (Xiamen) Co., Ltd., Xiamen (CN)

(72) Inventor: Tsung-Hong Lu, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 200 days.

(21) Appl. No.: 17/139,326

(22) Filed: Dec. 31, 2020

(65) Prior Publication Data

US 2021/0336081 A1 Oct. 28, 2021

(30) Foreign Application Priority Data

Apr. 27, 2020 (CN) .......................... 202010343954.8

(51) Int. Cl.
*H01L 33/14* (2010.01)
*H01L 33/38* (2010.01)
*H01L 33/40* (2010.01)

(52) U.S. Cl.
CPC ............ *H01L 33/145* (2013.01); *H01L 33/38* (2013.01); *H01L 33/40* (2013.01)

(58) Field of Classification Search
CPC combination set(s) only.
See application file for complete search history.

(56) References Cited

U.S. PATENT DOCUMENTS

| 2012/0267672 A1* | 10/2012 | Jeon | H01L 33/14 |
| | | | 257/E33.062 |
| 2013/0015470 A1* | 1/2013 | Tanaka | H01L 33/38 |
| | | | 257/79 |
| 2016/0247972 A1* | 8/2016 | Kuo | H01L 33/38 |
| 2017/0062653 A1* | 3/2017 | Huang | H01L 33/06 |
| 2017/0263816 A1* | 9/2017 | Yang | H01L 33/44 |
| 2018/0198023 A1* | 7/2018 | Kim | H01L 33/46 |
| 2020/0350467 A1* | 11/2020 | Lin | H01L 33/46 |

FOREIGN PATENT DOCUMENTS

| CN | 105895764 A | 8/2016 |
| CN | 210073905 U | 2/2020 |

\* cited by examiner

*Primary Examiner* — Mark W Tornow
*Assistant Examiner* — Priya M Rampersaud
(74) *Attorney, Agent, or Firm* — Hemisphere Law, PLLC; Zhigang Ma

(57) ABSTRACT

A semiconductor light-emitting device includes: a substrate, an epitaxial layer structure disposed on the substrate, a first current blocking layer disposed on the epitaxial layer structure, a second current blocking layer disposed on the epitaxial layer structure, a current spreading layer disposed on the epitaxial layer structure and covering the first current blocking layer; a first electrode disposed on a side of the current spreading layer facing away from the epitaxial layer structure, and a second electrode disposed on the epitaxial layer structure and covering the second current blocking layer. The first current blocking layer includes a first main blocking portion and a first extended blocking portion. The second current blocking layer includes a second main blocking portion and a second extended blocking portion. The second extended blocking portion includes spacings. The first extended blocking portion is formed with convex structures. The convex structures are aligned with the spacings.

8 Claims, 5 Drawing Sheets

SEMICONDUCTOR LIGHT-EMITTING DEVICE

FIELD OF THE DISCLOSURE

The disclosure relates to the field of semiconductor technologies, and more particularly to a semiconductor light-emitting device.

BACKGROUND OF THE DISCLOSURE

With the continuous development of LED industries, cost-effective advantages of LED products are becoming increasingly prominent. A conventional light-emitting diode (LED) is provided with a current blocking layer under a P-type electrode to block a current passing therethrough. That is, when the current is introduced by the P-type electrode, the current blocking layer can block the current passing therethrough, thereby forcing the current to bypass the current blocking layer and be spread out by a transparent conductive layer, so that brightness of the light emitting diode is improved consequently. However, the conventional light-emitting diode has an area where the current is too concentrated, resulting in a poor brightness enhancement effect of the light-emitting diode.

SUMMARY OF THE DISCLOSURE

Accordingly, embodiments of the disclosure provide a semiconductor light-emitting device, which can improve a current spreading of the semiconductor light-emitting device and increase a light-emitting efficiency of the semiconductor light-emitting device such as a light-emitting diode.

Specifically, an embodiment of the disclosure provides a semiconductor light-emitting device including: a substrate; an epitaxial layer structure, disposed on the substrate and including a first-type area and a second-type area; a first current blocking layer, disposed on the epitaxial layer structure and located in the first-type area; a second current blocking layer, disposed on the epitaxial layer structure and located in the second-type area; a current spreading layer, disposed on the epitaxial layer structure and located in the first-type area, wherein the current spreading layer covers the first current blocking layer and thereby the first current blocking layer is located between the current spreading layer and the epitaxial layer structure; a first electrode, disposed on a side of the current spreading layer facing away from the epitaxial layer structure, and being in electrically contact with the current spreading layer; a second electrode, disposed on the epitaxial layer structure and located in the second-type area, wherein the second current blocking layer is located between the second electrode and the epitaxial layer structure. Moreover, the first electrode includes a first main portion and a first elongated extension portion laterally extending form the first main portion. The first current blocking layer includes a first main blocking portion corresponding to the first main portion and a first extended blocking portion corresponding to the first elongated extension portion. The second electrode includes a second main portion and a second elongated extension portion laterally extending form the second main portion. The second current blocking layer includes a second main blocking portion corresponding to the second main portion and a second extended blocking portion corresponding to the second elongated extension portion, and the second extended blocking portion includes a plurality of spacings spaced from each other. A side of the first extended blocking portion near the second electrode is formed with a plurality of first convex structures, and the plurality of first convex structures are aligned with the plurality of spacings.

In an embodiment of the disclosure, the second extended blocking portions includes a plurality of extended blocking sub-portions separated from each other, adjacent two of the plurality of extended blocking sub-portions have one of the plurality of spacings located therebetween, the plurality of first convex structures and the plurality of extended blocking sub-portions are arranged in a staggered manner.

In an embodiment of the disclosure, the second extended blocking portion is a continuous structure, and the plurality of spacings are through holes penetrating through the second extended blocking portion.

In an embodiment of the disclosure, the first electrode further includes a third elongated extension portion laterally extending from the first main portion, the third elongated extension portion and the first elongated extension portion are located two opposite sides of the first main portion, and the second elongated extension portion is located between the first elongated extension portion and the third elongated extension portion.

In an embodiment of the disclosure, the first current blocking layer further includes a third extended blocking portion corresponding to the third elongated extension portion, a side of the third extended blocking portion near the second electrode is formed with a plurality of second convex structures, and the plurality of second convex structures are aligned with the plurality of spacings.

In an embodiment of the disclosure, the plurality of extended blocking sub-portions are arranged equidistantly.

In an embodiment of the disclosure, a width of each of the plurality of first convex structure is the same as a distance between adjacent two of the plurality of extended blocking sub-portions.

In an embodiment of the disclosure, the semiconductor light-emitting device further includes: an adhesion enhancement layer, disposed on a side of the current spreading layer facing away from the first current blocking layer, and comprising a plurality of through holes. The first electrode is disposed on a side of the adhesion enhancement layer facing away from the current spreading layer and extends into the plurality of through holes to electrically contact with the current spreading layer.

In an embodiment of the disclosure, the first electrode is a metal composite layer, and the metal composite layer along a direction facing away from the substrate includes an aluminum layer and a plurality of metal layers stacked on the aluminum layer; the aluminum layer extends into the plurality of through holes and is direct in contact with the adhesion enhancement layer and the current spreading layer.

In an embodiment of the disclosure, a material of the adhesion enhancement layer is a transparent electrically insulating material, and a light transmittance of the adhesion enhancement layer is greater than 85%.

The above technical solutions of the disclosure may have one or more of advantages or benefits as follows. In one aspect, by forming the plurality of first convex structure on the side of the first extended blocking portion near the second electrode, and making the plurality of first convex structures be aligned with the plurality of spacings of the second extended blocking portion, it can avoid excessive current concentration, the current spreading performance of the semiconductor light-emitting devices is improved, so that the semiconductor light-emitting device can generate radiation evenly, and the light-emitting efficiency of the semiconductor light-emitting device such as light-emitting diode is improved consequently. In another aspect, by disposing the adhesion enhancement layer being in direct contact with the aluminum layer of the first electrode, it can avoid the disadvantage of using the chromium layer or nickel layer in the first electrode, and further improve the light-emitting efficiency of the semiconductor light-emitting device.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

FIG. 1b is an enlarged cross-sectional view of the semiconductor light-emitting device according to the first embodiment, taken along the line I-I in FIG. 1a.

FIG. 2b is an enlarged cross-sectional view of the semiconductor light-emitting device according to the second embodiment, taken along the line II-II in FIG. 2a.

FIG. 3b is an enlarged cross-sectional view of the semiconductor light-emitting device according to the third embodiment, taken along the line III-III in FIG. 3a.

FIG. 4b is an enlarged cross-sectional view of the semiconductor light-emitting device according to the fourth embodiment, taken along the line IV-IV in FIG. 4a.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protection scope of the disclosure.

It should be noted that the terms "first" and "second" in the description and claims of the disclosure and the above drawings are used to distinguish similar objects, rather than to limit a specific order or sequence. It should be understood that the terms used in this way can be interchanged under appropriate circumstances so that the embodiments of the disclosure described herein can be implemented in an order other than those illustrated or described herein. In addition, the terms "including" and "having" and any variations thereof are intended to cover non-exclusive inclusions, for example, a process, method, system, product or device containing a series of steps or units need not be limited to the clearly listed step(s) or unit(s), but may include other step(s) or unit(s) not explicitly listed or inherent to the process, method, system, product or device.

First Embodiment

Figure 1A:
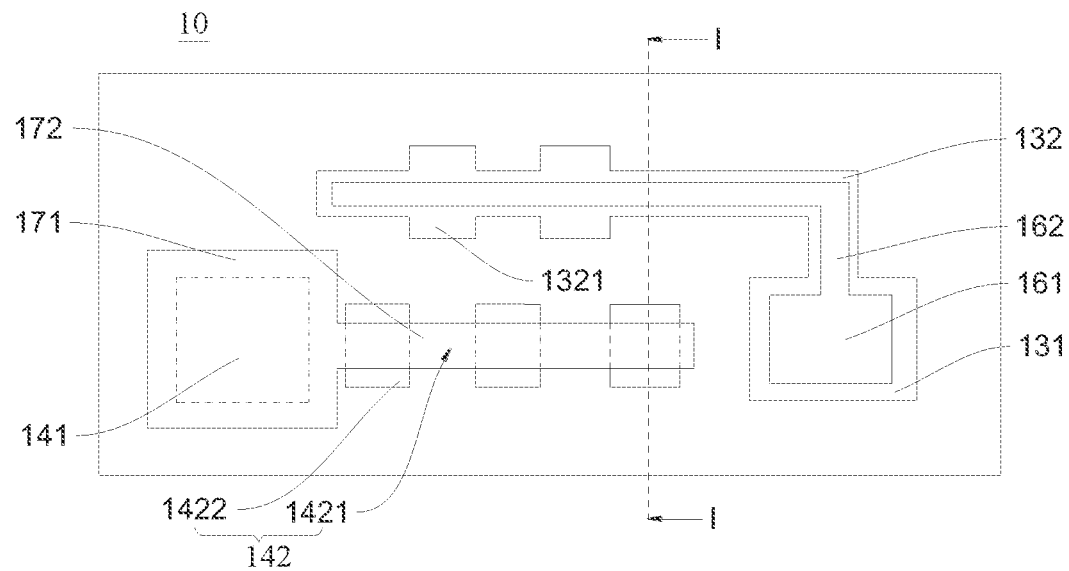
FIG. 1a is a partial schematic structural view of a semiconductor light-emitting device according to a first embodiment of the disclosure, for the purpose of illustrating electrodes and current blocking layers.
Figure 1B:
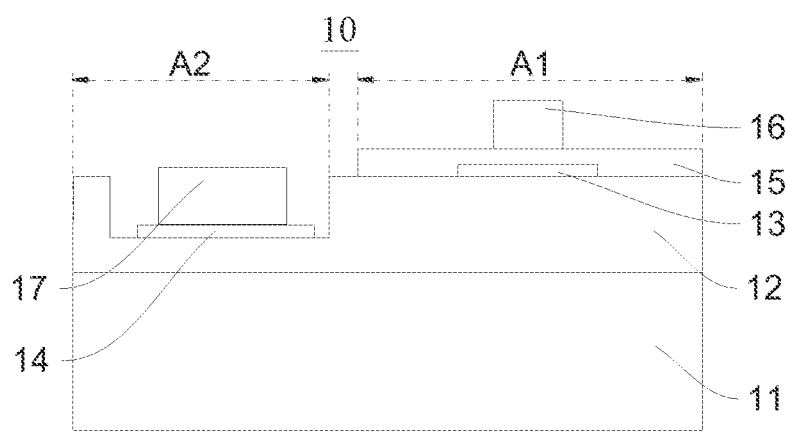

Referring to FIG. 1a and FIG. 1b, the first embodiment of the disclosure provides a semiconductor light-emitting device 10 such as a light-emitting diode (LED). As illustrated in FIG. 1a and FIG. 1b, the semiconductor light-emitting device 10 exemplarily includes: a substrate 11, an epitaxial layer structure 12, a current blocking layer 13, another current blocking layer 14, a current spreading layer 15, an electrode 16 and another electrode 17.

In particular, as shown in FIG. 1b, the epitaxial layer structure 12 is disposed on the substrate 11 and includes an area A1 and another area A2. The current blocking layer 13 is disposed on the epitaxial layer structure 12 and located in the area A1. The current blocking layer 14 is disposed on the epitaxial layer structure 12 and located in the area A2. The current spreading layer 15 is disposed on the epitaxial layer structure 12 and located in the area A1. The current spreading layer 15 covers the current blocking layer 13 and thereby the current blocking layer 13 is located between the current spreading layer 15 and the epitaxial layer structure 12. The electrode 16 is disposed on a side of the current spreading layer 15 facing away from the epitaxial layer structure 12 and in electrically contact with the current spreading layer 15. The electrode 17 is disposed on the epitaxial layer structure 12 and located in the area A2, and the current blocking layer 14 is located between the electrode 17 and the epitaxial layer structure 12. As shown in FIG. 1a, the electrode 16 includes a main portion 161 and an elongated extension portion 162 laterally extending from the main portion 161. The current blocking layer 13 includes a main blocking portion 131 corresponding to the main portion 161, and an extended blocking portion 132 corresponding to the elongated extension portion 162 and integrally formed with the main blocking portion 131, that is, the main blocking portion 131 and the extended blocking portion 132 are a one-piece structure. The electrode 17 includes a main portion 171 and an elongated extension portion 172 laterally extending from the main portion 171. The current blocking layer 14 includes a main blocking portion 141 corresponding to the main portion 171, and an extended blocking portion 142 corresponding to the elongated extension portion 172. The extended blocking portion 142 includes for example multiple (i.e., more than one) spacings 1421 spaced from each other. The extended blocking portion 132 is formed with multiple convex structures 1321 at a side thereof near the electrode 17. The convex structures 1321 are aligned with the spacings 1421 respectively. For example, the convex structures 1321 and the spacings 1421 are aligned along an extending direction (i.e., lengthwise direction) of the elongated extension portion 172, e.g., along the horizontal direction in FIG. 1a.

Moreover, as shown in FIG. 1a, the extended blocking portion 142 includes for example multiple extended blocking sub-portions 1422 spaced from each other. Adjacent two of the extended blocking sub-portions 1422 have one of the spacings 1421 located therebetween, so that the elongated extension portion 172 of the electrode 17 is directly in contact with the epitaxial layer structure 12 in the spacing 1421. The convex structures 1321 and the extended blocking sub-portions 1422 are arranged in a staggered manner along the extending direction of the elongated extension portion 172.

Figure 1C:
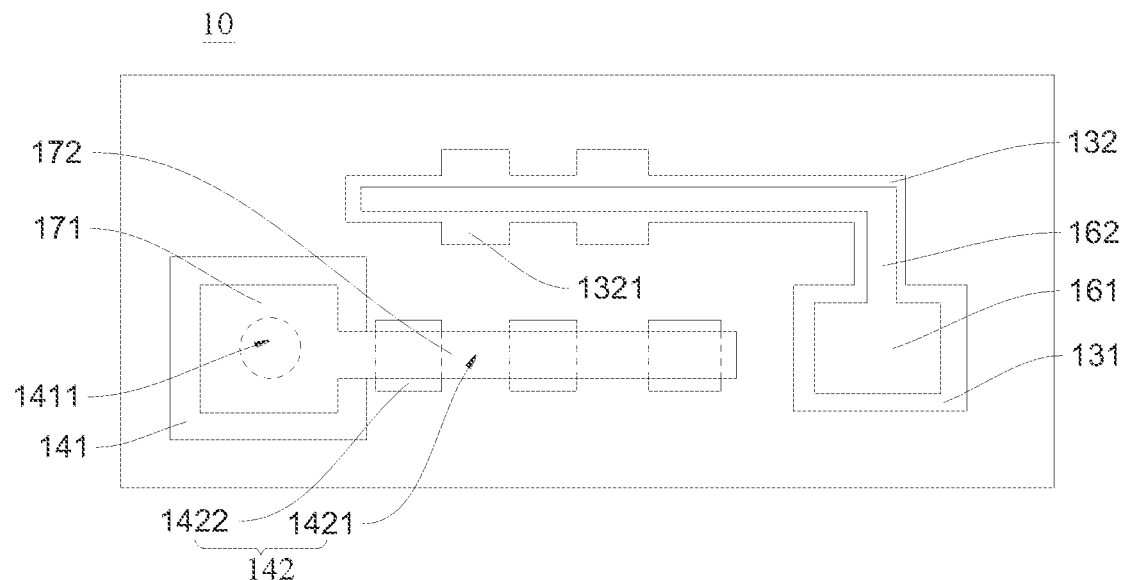
FIG. 1c is a partial schematic structural view of another semiconductor light-emitting device according to the first embodiment of the disclosure, for the purpose of illustrating electrodes and current blocking layers.

As illustrated in FIG. 1a, the main portion 171 of the electrode 17 for example completely covers the main blocking portion 141 of the current blocking layer 14. Of course, the embodiment of the disclosure is not limited to this, the main portion 171 of the electrode 17 may partially cover the main blocking portion 141 of the current blocking layer 14 instead, for instance, as shown in FIG. 1c, the main blocking portion 141 of the current blocking layer 14 exemplarily is formed with a through hole 1411, the main portion 171 of the electrode 17 is disposed on the main blocking portion 141 and filled into the through hole 1411 to thereby contact with the epitaxial layer structure 12.

The substrate 11 is for example a semiconductor material such as one of silicon, sapphire and silicon carbide, or other material well known to those skilled in the art that is suitable for growing a semiconductor light-emitting material such as gallium nitride material.

The epitaxial layer structure 12 typically is a multi-layered structure, for example, the epitaxial layer structure 12 upwards from the substrate 11 at least includes a N-type GaN epitaxial layer, a multiple quantum well light-emitting layer and a P-type GaN epitaxial layer. The area A1 is for example a P-type semiconductor area, the area A2 is for example a N-type semiconductor area, the area A2 is formed for example by etching in the MESA process, for instance, etching off the P-type GaN epitaxial layer, the multiple quantum well light-emitting layer and a part of the N-type GaN epitaxial layer of the epitaxial layer structure 12 corresponding to the N-type semiconductor area and retaining another part of the N-type GaN epitaxial layer.

The current blocking layer 13 is an electrically insulating layer. On one hand, the current blocking layer 13 may block a current spreading between the P-type GaN epitaxial layer of the lower epitaxial layer structure 12 and the upper current spreading layer 15, and guide a current towards an area far away from the electrode 16 to thereby reduce a current crowding near the electrode 16 and improve a light-output power, so that the light-emitting efficiency of the semiconductor light-emitting device 10 is improved and the brightness is increased; and on the other hand, the current blocking layer 13 may reduce light loss caused by light absorption and light shielding of the electrode 16.

The current blocking layer 14 is an electrically insulating layer. The current blocking layer 14 may block a current spreading between the N-type GaN epitaxial layer of the lower epitaxial layer structure 12 and the upper electrode 17, and guide a current towards an area far away from the electrode 17 to thereby reduce a current crowding near the electrode 17 and improve a light-output power, so that the light-emitting efficiency of the semiconductor light-emitting device 10 is improved and the brightness is increased.

Specifically, the current blocking layer 13 and the current blocking layer 14 each are made of a material such as silicon dioxide, titanium dioxide, aluminum oxide, silicon nitride, or any one of combinations thereof.

The extended blocking sub-portions 1422 are arranged equidistantly, for example, are arranged equidistantly along the extending direction of the elongated extension portion 172. The extended blocking sub-portions 1422 are for example the same in size and shape. The convex structure 1321 is formed for example by locally widening the extended blocking portion 132, so that the side of the extended blocking portion 132 near the electrode 17 is a concave-convex structure. More specifically, a width of the convex structure 1321 in the extending direction of the elongated extension portion 172 is for example the same as a distance between adjacent two of the extended blocking sub-portions 1422. Another width of the convex structure 1321 in a direction (e.g., the vertical direction in FIG. 1a) perpendicular to the extending direction of the elongated extension portion 172 may be adjusted according to voltage rules and actual needs. It should be noted that, the illustrated embodiment does not limit the specific shape of the convex structure 1321, which is, for example, the rectangle shown in FIG. 1a, or it can also be trapezoidal and other shape. In addition, in order to control the distribution of current, the extended blocking sub-portions 1422 may also be arranged at unequal intervals in the aforementioned extending direction, and the extended blocking sub-portions 1422 may have different sizes and shapes instead.

The current spreading layer 15 is a transparent layer and configured (i.e., structured and arranged) for performing functions of conduction and current spreading, thereby solving the problem of weak current lateral spreading ability at the P-type GaN epitaxial layer of the epitaxial layer structure 12. For instance, the current spreading layer 15 is for example an ITO (indium-tin oxide) current spreading layer, also referred to as an ITO transparent electrically conductive layer. In addition, the current spreading layer 15 may also be ZITO, ZIO, GIO, FTO, AZO, GZO, $In_4Sn_3O_{12}$ or NiAu current spreading layer.

The electrode 16 and the electrode 17 each are for example a metal composite layer. The metal composite layer includes for example a chromium (Cr) or nickel (Ni) layer and an aluminum (Al) layer, a titanium (Ti) layer, a platinum (Pt) layer and a gold (Au) layer stacked on the chromium or nickel layer in that order along a direction facing away from the substrate 11.

It is noted that, the illustrated embodiment does not limit the shapes of the electrode 16 and the electrode 17 as illustrated in FIG. 1a, and the shapes of electrodes 16 and 17 shown in FIG. 1a are only for better understanding of the embodiment. The main portion 161 may also be circular, the main portion 161 is mainly used to connect to an external voltage, and the elongated extension portion 162 may help to spread the current. The main portion 171 may also be circular, the main portion 171 is mainly used to connect to an external voltage, and the elongated extension portion 172 may help to spread the current. In addition, the electrode 16 is for example an anode, i.e., P-type electrode; and the electrode 17 is for example a cathode, i.e., N-type electrode.

Sum up, as to the semiconductor light-emitting device provided in this embodiment, by disposing the convex structures 1321 at the side of the extended blocking portion 162 near the electrode 17, and the convex structures 1321 and the extended blocking sub-portions 1422 being arranged in a staggered manner, it can avoid excessive current concentration, the current spreading performance of the semiconductor light-emitting devices is improved, so that the semiconductor light-emitting device can generate radiation evenly, and the light-emitting efficiency of the semiconductor light-emitting device such as light-emitting diode is improved consequently.

Second Embodiment

Figure 2A:
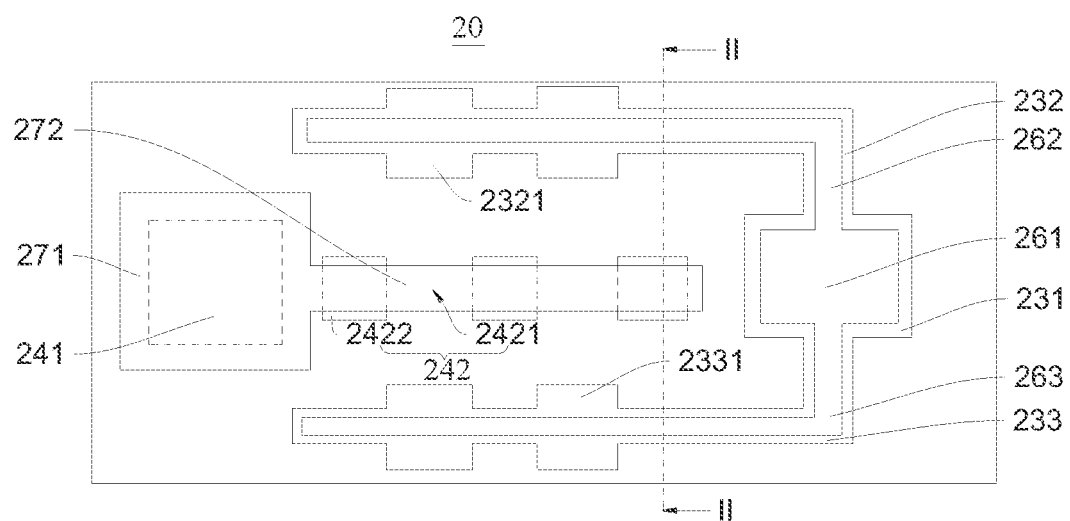
FIG. 2a is a partial schematic structural view of a semiconductor light-emitting device according to a second embodiment of the disclosure, for the purpose of illustrating electrodes and current blocking layers.
Figure 2B:
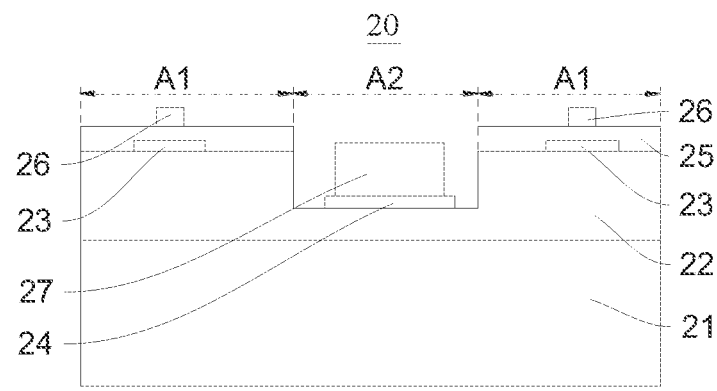

Referring to FIG. 2a and FIG. 2b, the second embodiment of the disclosure provides a semiconductor light-emitting device 20. As illustrated in FIG. 2a and FIG. 2b, the semiconductor light-emitting device 20 is similar to the semiconductor light-emitting device 10. The semiconductor light-emitting device 20 includes for example a substrate 21, an epitaxial layer structure 22, a current blocking layer 23, another current blocking layer 24, a current spreading layer 25, an electrode 26 and another electrode 27.

In particular, as shown in FIG. 2b, the epitaxial layer structure 22 is disposed on the substrate 21 and includes an area A1 and another area A2. The current blocking layer 23 is disposed on the epitaxial layer structure 22 and located in the area A1. The current blocking layer 24 is disposed on the epitaxial layer structure 22 and located in the area A2. The current spreading layer 25 is disposed on the epitaxial layer structure 22 and located in the area A1. The current spreading layer 25 covers the current blocking layer 23 and thereby the current blocking layer 23 is located between the current spreading layer 25 and the epitaxial layer structure 22. The electrode 26 is disposed on a side of the current spreading layer 25 facing away from the epitaxial layer structure 22 and in electrically contact with the current spreading layer 25. The electrode 27 is disposed on the epitaxial layer structure 22 and located in the area A2. The current blocking layer 24 is located between the electrode 27 and the epitaxial layer structure 22. As shown in FIG. 2a, the electrode 26 includes a main portion 261 and an elongated extension portion 262 laterally extending from the main portion 261. The current blocking layer 23 includes a main blocking portion 231 corresponding to the main portion 261, and an extended blocking portion 232 corresponding to the elongated extension portion 262 and integrally formed with the main blocking portion 231, that is, the main blocking portion 231 and the extended blocking portion 232 are a one-piece structure. The electrode 27 includes a main portion 271 and an elongated extension portion 272 laterally extending from the main portion 271. The current blocking layer 24 includes a main blocking portion 241 corresponding to the main portion 271, and an extended blocking portion 242 corresponding to the elongated extension portion 272. The extended blocking portion 242 includes for example multiple spacings 2421 spaced from each other, that is, the extended blocking portion 242 is a discontinuous/discrete structure. the extended blocking portion 232 is disposed with multiple convex structures 2321 at a side thereof near the electrode 27. The convex structures 2321 are aligned with the spacings 2421. For instance, the convex structures 2321 and the spacings 2421 are aligned along an extending direction (i.e., lengthwise direction) of the elongated extension portion 272, e.g., along the horizontal direction in FIG. 2a.

The extended blocking portion 242 includes for example multiple extended blocking sub-portions 2422 spaced from each other. Adjacent two of the extended blocking sub-portions 2422 have one of the spacings 2421 located therebetween, so that the elongated extension portion 272 of the electrode 27 is directly in contact with the epitaxial layer structure 22 in the spacing 2421. The convex structures 2321 and the extended blocking sub-portions 2422 are arranged in a staggered manner.

Differences between the semiconductor light-emitting device 20 and the semiconductor light-emitting device 10 are as follows. The electrode 26 further includes another elongated extension portion 263 laterally extending from the main portion 261. The elongated extension portion 263 and the elongated extension portion 262 are located at two sides of the main portion 261 respectively. The elongated extension portion 272 is located between the elongated extension portion 262 and the elongated extension portion 263. The current blocking layer 23 further includes another extended blocking portion 233 corresponding to the elongated extension portion 263 and integrally formed with the main blocking portion 231, that is, the extended blocking portions 232, 233 and the main blocking portion 231 are a one-piece structure. A side of the extended blocking portion 233 near the electrode 27 is formed with multiple convex structures 2331. The convex structures 2331 are aligned with the spacings 2421, so that the convex structures 2331 and the extended blocking sub-portions 2422 are arranged in a staggered manner along the extending direction of the elongated extension portion 272.

The convex structure 2331 is the same as the convex structure 2321, for example, the convex structure 2331 is formed by locally widening the extended blocking portion 233. More specifically, a width of the convex structure 2331 in the extending direction of the elongated extension portion 272 is equal to a distance between adjacent two of the extended blocking sub-portions 2422. Another width of the convex structure 2331 in a direction (the vertical direction in FIG. 2a) perpendicular to the extending direction of the elongated extension portion 272 may be adjusted according to voltage rules and actual needs. In addition, in order to control a current distribution, the extended blocking sub-portions 2422 may be arranged at unequal intervals in the extending direction of the elongated extension portion 272, and the extended blocking sub-portions 2422 may be different in size and shape.

It is noted that, the illustrated embodiment does not limit the shapes of the electrode 26 and the electrode 27 as illustrated in FIG. 2a, and the shapes of electrodes 26 and 27 shown in FIG. 2a are only for better understanding of the embodiment. The illustrated embodiment does not limit the specific shapes of the convex structures 2321 and the convex structures 2331, and the shapes of the convex structures 2321, 2331 may be the rectangles shown in FIG. 2a, or other shape such as trapezoid. Of course, the shape of the convex structure 2321 may be different from that of the convex structure 2331.

Third Embodiment

Figure 3A:
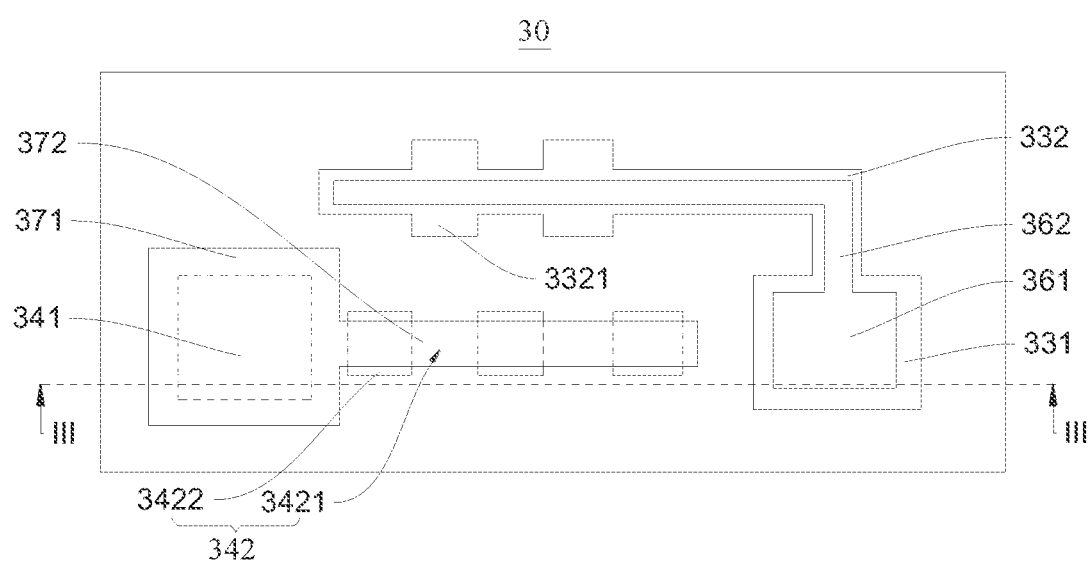
FIG. 3a is a partial schematic structural view of a semiconductor light-emitting device according to a third embodiment of the disclosure, for the purpose of illustrating electrodes and current blocking layers.
Figure 3B:
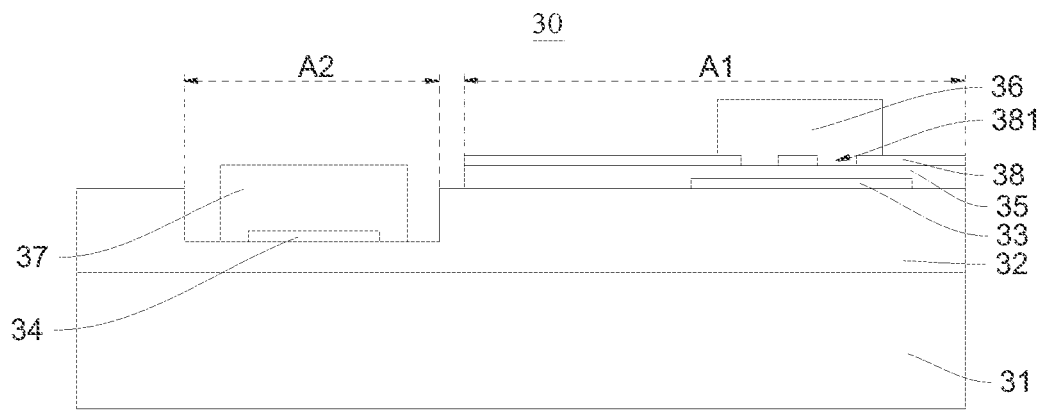

Referring to FIG. 3a and FIG. 3b, the third embodiment of the disclosure provides a semiconductor light-emitting device 30. As illustrated in FIG. 3a and FIG. 3b, the semiconductor light-emitting device 30 is similar to the semiconductor light-emitting device 10 and includes for example a substrate 31, an epitaxial layer structure 32, a current blocking layer 33, another current blocking layer 34, a current spreading layer 35, an electrode 36 and another electrode 37.

In particular, as shown in FIG. 3b, the epitaxial layer structure 32 is disposed on the substrate 31 and includes an area A1 and another area A2. The current blocking layer 33 is disposed on the epitaxial layer structure 32 and located in the area A1. The current blocking layer 34 is disposed on the epitaxial layer structure 32 and located in the area A2. The current spreading layer 35 is disposed on the epitaxial layer structure 32 and located in the area A1. The current spreading layer 35 covers the current blocking layer 33 and thereby the current blocking layer 33 is located between the current spreading layer 35 and the epitaxial layer structure 32. The electrode 36 is disposed on a side of the current spreading layer 35 facing away from the epitaxial layer structure 32 and in electrically contact with the current spreading layer 35. The electrode 37 is disposed on the epitaxial layer structure 32 and located in the area A2. The current blocking layer 34 is located between the electrode 37 and the epitaxial layer structure 32. As shown in FIG. 3a, the electrode 36 includes a main portion 361 and an elongated extension portion 362 laterally extending from the main portion 361. The current blocking layer 33 includes a main blocking portion 331 corresponding to the main portion 361, and an extended blocking portion 332 corresponding to the elongated extension portion 362 and integrally formed with the main blocking portion 331, that is, the main blocking portion 331 and the extended blocking portion 332 are a one-piece structure. The electrode 37 includes a main portion 371 and an elongated extension portion 372 laterally extending from the main portion 371. The current blocking layer 34 includes a main blocking portion 341 corresponding to the main portion 371, and an extended blocking portion 342 corresponding to the elongated extension portion 372. The extended blocking portion 342 includes for example multiple (i.e., more than one) spacings 3421 spaced from each other. The extended blocking portion 332 is formed with multiple convex structures 3321 at a side thereof near the electrode 37. The convex structures 3321 are aligned with the spacings 3421 respectively. For example, the convex structures 3321 and the spacings 3421 are aligned along an extending direction (i.e., lengthwise direction) of the elongated extension portion 372, e.g., along the horizontal direction in FIG. 3a.

The extended blocking portion 342 includes for example multiple extended blocking sub-portions 3422 spaced from each other. Adjacent two of the extended blocking sub-portions 3422 have one of the spacings 3421 located therebetween, so that the elongated extension portion 372 of the electrode 37 is directly in contact with the epitaxial layer structure 32 in the spacing 3421. The convex structures 3321 and the extended blocking sub-portions 3422 are arranged in a staggered manner. The main portion 371 of the electrode 37 for example covers the main blocking portion 341 of the current blocking layer 34, and the current blocking layer 34 is located between the electrode 37 and the epitaxial layer structure 32.

Differences between the semiconductor light-emitting device 30 and the semiconductor light-emitting device 10 are as follows. The semiconductor light-emitting device 30 further includes an adhesion enhancement layer 38. The adhesion enhancement layer 38 is disposed on a side of the current spreading layer 35 facing away from the current blocking layer 33 and includes multiple through holes 381. The electrode 36 is disposed on a side of the adhesion enhancement layer 38 facing away from the current spreading layer 35 and extended into the through holes 381 to electrically contact with the current spreading layer 35.

The electrode 36 is a metal composite layer, and along a direction facing away from the substrate 31, includes an aluminum layer and multiple metal layers stacked on the aluminum layer. The aluminum layer of the electrode 36 extends into the through holes 381 and in direct contact with the adhesion enhancement layer 38 and the current spreading layer 35.

The multiple metal layers stacked on the aluminum layer in the electrode 36 includes for example a titanium layer, a platinum layer and a gold layer. That is, the electrode 36 in this embodiment is different from the electrode 16 in the first embodiment in structure, and the electrode 36 in this embodiment does not contain for example the chromium or nickel layer.

A material of the adhesion enhancement layer 38 is a transparent electrically insulating material. A light transmittance of the adhesion enhancement layer 38 is for example greater than 85%. The material of the adhesion enhancement layer 38 is for example silicon dioxide, aluminum oxide, silicon nitride or other transparent electrically insulating material, and the through holes 381 of the adhesion enhancement layer 38 is for example arranged equidistantly, as a result, the stability of attachment is enhanced. The through holes 381 each are for example a circular through hole or other shaped through hole.

In the above first embodiment, the electrode 16 is for example a five-layered metal structure and the metal layer near the substrate 11 generally is the chromium layer or nickel layer. In the third embodiment, the chromium or nickel layer of the electrode 11 is removed to obtain the electrode 36, based on a good adhesion between the aluminum layer and the transparent electrically insulating material, that is, the adhesion between the aluminum layer of the electrode 36 and the adhesion enhancement layer 38, the electrode 36 is fixed, and a current on the electrode 36 passes through the multiple through holes 381 of the adhesion enhancement layer 38 for electrical conduction, thereby further improving the light-emitting efficiency of the semiconductor light-emitting device.

Fourth Embodiment

Figure 4A:
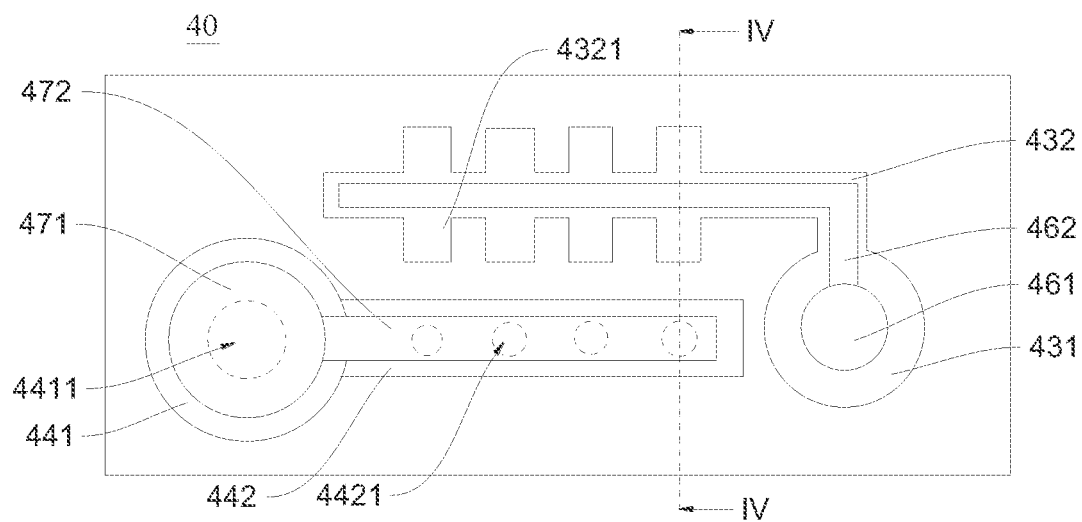
FIG. 4a is a partial schematic structural view of a semiconductor light-emitting device according to a fourth embodiment of the disclosure, for the purpose of illustrating electrodes and current blocking layers.
Figure 4B:
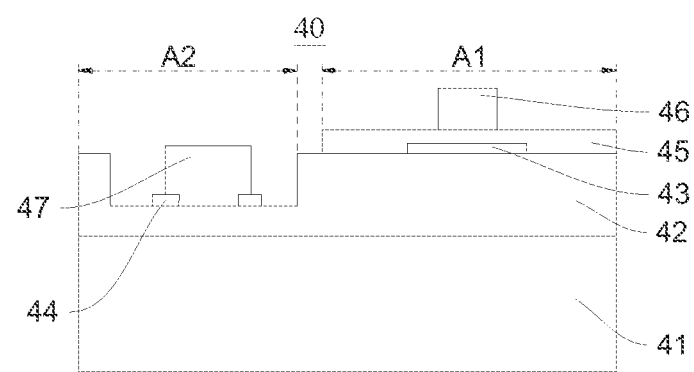

Referring to FIG. 4a and FIG. 4b, the fourth embodiment of the disclosure provides a semiconductor light-emitting device 40. As illustrated in FIG. 4a and FIG. 4b, the semiconductor light-emitting device 40 is similar to the semiconductor light-emitting device 10. The semiconductor light-emitting device 40 includes for example a substrate 41, an epitaxial layer structure 42, a current blocking layer 43, another current blocking layer 44, a current spreading layer 45, an electrode 46 and another electrode 47.

In particular, as shown in FIG. 4b, the epitaxial layer structure 42 is disposed on the substrate 41 and includes an area A1 and another area A2. The current blocking layer 43 is dispose don the epitaxial layer structure 42 and located in the area A1. The current blocking layer 44 is disposed on the epitaxial layer structure 42 and located in the area A2. The current spreading layer 45 is disposed on the epitaxial layer structure 42 and located in the area A1. The current spreading layer 45 covers the current blocking layer 43 and thereby the current blocking layer 43 is located between the current spreading layer 45 and the epitaxial layer structure 42. The electrode 46 is disposed on a side of the current spreading layer 45 facing away from the epitaxial layer structure 42 and in electrically contact with the current spreading layer 45. The electrode 47 is disposed on the epitaxial layer structure 42 and located in the area A2. The current blocking layer 44 is located between the electrode 47 and the epitaxial layer structure 42. As shown in FIG. 4a, the electrode 46 includes a main portion 461 and an elongated extension portion 462 laterally extending from the main portion 461. The current blocking layer 43 includes a main blocking portion 431 corresponding to the main portion 461, and an extended blocking portion 432 corresponding to the elongated extension portion 462 and integrally formed with the main blocking portion 431, that is, the main blocking portion 431 and the extended blocking portion 432 are a one-piece structure. The electrode 47 includes a main portion 471 and an elongated extension portion 472 laterally extending from the main portion 471. The current blocking layer 44 includes a main blocking portion 441 corresponding to the main portion 471, and an extended blocking portion 442 corresponding to the elongated extension portion 472. The extended blocking portion 442 includes for example multiple spacings 4421 spaced from each other. A side of the extended blocking portion 432 near the electrode 47 is formed with multiple convex structures 4321. The convex structures 4321 are aligned with the spacings 4421. For instance, the convex structures 4321 and the spacings 4421 are aligned along an extending direction (i.e., lengthwise direction) of the elongated extension portion 472, e.g., the horizontal direction in FIG. 4a.

Differences between the semiconductor light-emitting device 40 and the semiconductor light-emitting device 10 are as follows. The extended blocking portion 442 is a one-piece structure (also referred to as continuous structure), and the extended blocking portion 442 is integrally formed with the main blocking portion 441 so that the current blocking layer 44 is a one-piece structure. Moreover, the spacings 4421 are for example through holes penetrating through the extended blocking portion 442. A width of the convex structure 4321 in the extending direction of the elongated extension portion 472 is for example the same as a diameter of the through hole on the extended blocking portion 442. The diameters of adjacent two of the spacings 4421 i.e., the through holes may be the same or different from each other. In addition, the main blocking portion 441 is for example formed with a through hole 4411, and the main portion 471 of the electrode 47 is filled into the through hole 4411 to contact with the epitaxial layer structure 42.

It is noted that in other embodiment of the disclosure, the main blocking portion 441 may not be formed with the through hole 4411 instead, and correspondingly the main portion 471 of the electrode 47 completely covers the main blocking portion 441 to achieve electrically contact with the epitaxial layer structure.

In other embodiment of the disclosure, the extended blocking portion 442 may be the same as that in the first embodiment and include multiple extended blocking sub-portions spaced from each other, and the convex structures 4321 and the multiple extended blocking sub-portions being arranged in a staggered manner.

Finally, it should be noted that the above embodiments are only used to illustrate the technical solutions of the invention, rather than to limit the invention. Although the invention has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the invention.

What is claimed is:

1. A semiconductor light-emitting device, comprising:
a substrate;
an epitaxial layer structure, disposed on the substrate and comprising a first-type area and a second-type area;
a first current blocking layer, disposed on the epitaxial layer structure and located in the first-type area;
a second current blocking layer, disposed on the epitaxial layer structure and located in the second-type area;
a current spreading layer, disposed on the epitaxial layer structure and located in the first-type area, wherein the current spreading layer covers the first current blocking layer and thereby the first current blocking layer is located between the current spreading layer and the epitaxial layer structure;
a first electrode, disposed on a side of the current spreading layer facing away from the epitaxial layer structure, and being in electrically contact with the current spreading layer;
a second electrode, disposed on the epitaxial layer structure and located in the second-type area, wherein the second current blocking layer is located between the second electrode and the epitaxial layer structure;
wherein the first electrode comprises a first main portion and a first elongated extension portion laterally extending from the first main portion, the first current blocking layer comprises a first main blocking portion corresponding to the first main portion and a first extended blocking portion corresponding to the first elongated extension portion, the second electrode comprises a second main portion and a second elongated extension portion laterally extending from the second main portion, the second current blocking layer comprises a second main blocking portion corresponding to the second main portion and a second extended blocking portion corresponding to the second elongated extension portion, and the second extended blocking portion comprises a plurality of spacings spaced from each other;
wherein a side of the first extended blocking portion near the second electrode is formed with a plurality of first convex structures, and the plurality of first convex structures are aligned with the plurality of spacings;
wherein the first electrode further comprises a third elongated extension portion laterally extending from the first main portion, the third elongated extension portion and the first elongated extension portion are located two opposite sides of the first main portion, and the second elongated extension portion is located between the first elongated extension portion and the third elongated extension portion; and
wherein the first current blocking layer further comprises a third extended blocking portion corresponding to the third elongated extension portion, a side of the third extended blocking portion near the second electrode is formed with a plurality of second convex structures, and the plurality of second convex structures are aligned with the plurality of spacings.

2. The semiconductor light-emitting device as claimed in claim 1, wherein the second extended blocking portions comprises a plurality of extended blocking sub-portions separated from each other, adjacent two of the plurality of extended blocking sub-portions have one of the plurality of spacings located therebetween, the plurality of first convex structures and the plurality of extended blocking sub-portions are arranged in a staggered manner.

3. The semiconductor light-emitting device as claimed in claim 1, wherein the second extended blocking portion is a continuous structure, and the plurality of spacings are through holes penetrating through the second extended blocking portion.

4. The semiconductor light-emitting device as claimed in claim 2, wherein the plurality of extended blocking sub-portions are arranged equidistantly.

5. The semiconductor light-emitting device as claimed in claim 4, wherein a width of each of the plurality of first convex structure is the same as a distance between adjacent two of the plurality of extended blocking sub-portions.

6. The semiconductor light-emitting device as claimed in claim 1, further comprising:

an adhesion enhancement layer, disposed on a side of the current spreading layer facing away from the first current blocking layer, and comprising a plurality of through holes;

wherein the first electrode is disposed on a side of the adhesion enhancement layer facing away from the current spreading layer and extends into the plurality of through holes to electrically contact with the current spreading layer.

7. The semiconductor light-emitting layer as claimed in claim 6, wherein the first electrode is a metal composite layer, and the metal composite layer along a direction facing away from the substrate comprises an aluminum layer and a plurality of metal layers stacked on the aluminum layer; the aluminum layer extends into the plurality of through holes and is direct in contact with the adhesion enhancement layer and the current spreading layer.

8. The semiconductor light-emitting layer as claimed in claim 6, wherein a material of the adhesion enhancement layer is a transparent electrically insulating material, and a light transmittance of the adhesion enhancement layer is greater than 85%.

* * * * *